(12) United States Patent
Voutilainen

(10) Patent No.: US 7,803,017 B2
(45) Date of Patent: Sep. 28, 2010

(54) SIMULTANEOUS BIDIRECTIONAL CABLE INTERFACE

(75) Inventor: Martti Kalevi Voutilainen, Espoo (FI)

(73) Assignee: Nokia Corporation, Espoo (FI)

( * ) Notice: Subject to any disclaimer, the term of this patent is extended or adjusted under 35 U.S.C. 154(b) by 319 days.

(21) Appl. No.: 11/653,929

(22) Filed: Jan. 17, 2007

(65) Prior Publication Data

US 2008/0067637 A1 Mar. 20, 2008

(30) Foreign Application Priority Data

Sep. 15, 2006 (EP) .................................. 06019369

(51) Int. Cl.
*H01R 33/945* (2006.01)
(52) U.S. Cl. ..................................... 439/577
(58) Field of Classification Search ................ 439/577, 439/701; 257/678, 664
See application file for complete search history.

(56) References Cited

U.S. PATENT DOCUMENTS

| | | | | |
|---|---|---|---|---|
| 4,856,023 A * | 8/1989 | Singh | ......................... | 375/212 |
| 2002/0137476 A1 | 9/2002 | Shin | | |
| 2002/0153977 A1 | 10/2002 | McDonough et al. | | |
| 2004/0245610 A1* | 12/2004 | Zhong et al. | ................ | 257/678 |
| 2005/0200413 A1 | 9/2005 | Fujimori et al. | | |

FOREIGN PATENT DOCUMENTS

JP 62119949 A 6/1987

JP 200035775 A 12/2000

OTHER PUBLICATIONS

Evelina Yeung and Mark A. Horowitz, "A 2.4 Gb/s/pin Simultaneous Bidirectional Parallel Link with Perpin Skew Compensation", IEEE Journal of Solid-State Circuits, vol. 35, No. 11, Nov. 2000, pp. 1619.
Robert Drost, "Architecture and Design of a Simultaneously Bidirectional Single-ended High Speed Chip-to-Chip Interface", SMLI TR-2002-107, Feb. 2002.
Casper B et al., "An 8-Gb/s Simultaneous Bidirectional Link with on-die Waveform Capture" IEEE Journal of Solid-State Circuits, IEEE Service Center, vol. 38, No. 12, Dec. 2003, pp. 2111-2120 XP011104339.
Toshiro Takahashi et al., "110-GB/s Simultaneous Bidirectional Transceiver Logic Synchronized with a System Clock" IEEE Journal of Solid-State Circuits, IEEE Service Center, vol. 34, No. 11, Nov. 1999, p. 1526, 1527 and p. 1530.
PCT International Search Report, PCT/IB2007/002330, maildate Aug. 5, 2008.

* cited by examiner

*Primary Examiner*—Jean F Duverne
(74) *Attorney, Agent, or Firm*—Banner & Witcoff, Ltd.

(57) ABSTRACT

A cable connection with at least one cable as a wire conducted signal interconnection between two cables module circuits connected to respective ends of the cable connection. Conductors of the cable may be directly and permanent electrical connected at each end to the respective contacts at the respective cable module circuit. The cable module circuits may be arranged for sending and/or receiving of a wire-conducted signal transmitted via the cable connection. During fabrication of the integrated cable module the cable module circuits can be matched to the respective cable impedance with high accuracy. Further, by connecting the cable permanent and directly to transceiver circuits at each end of the cable, the connection may be protected from different kinds of disturbances, enabling high simultaneous bidirectional bit rates using such interconnections between electronic units or modules.

18 Claims, 8 Drawing Sheets

SIMULTANEOUS BIDIRECTIONAL CABLE INTERFACE

FIELD OF THE INVENTION

The present invention relates to an integrated cable module circuit, a cable connection for simultaneous bidirectional signaling comprising the integrated cable module circuit, the use of such integrated cable module circuit and of such cable connection and a method of manufacture for the integrated cable module circuit as well as the cable connection.

BACKGROUND

Serial high-speed interfaces use typically one differential wire pair or one optical fiber, also called one lane, per direction. For instance, two pairs are used for bidirectional transmission, in data transmission as, for instance, in serial ATA (advanced technology attachment) and Peripheral Component Interconnect (PCI) Express (PCIe), which uses existing PCI programming concepts, but on a completely different and much faster serial physical-layer communications protocol.

In PCIe, at the electrical level, each lane utilizes two unidirectional low voltage differential signaling pairs at 2.5 Gb/s. Transmit and receive are separate differential pairs, for a total of 4 data wires per lane. As with all high-speed serial transmission protocols, clocking information must be embedded in the signal. At the physical level, PCIe utilizes the very common 8B/10B encoding scheme to ensure that strings of consecutive ones or consecutive zeros are limited in length, so that the receiver does not lose track of where the bit edges are. This coding scheme replaces 8 uncoded (payload) bits of data with 10 (encoded) bits of transmitted data, consuming 20% of the overall electrical bandwidth.

Alternatively, one lane may be used for both directions, by using of the lane with a time division access (time-shared) scheme, where given (or negotiated) time slots are used for transmission from end A to end B or vice versa, respectively, which is used in Universal serial Bus (USB), for example.

Even simultaneous bidirectional transmission is a very old method in telecommunication; one problem in conventional systems is formed by the signal reflected back to the transmitting unit. There is no method for eliminating this reflected part without undue efforts as besides other very complicated calibration to every cable length and transceiver return loss behavior.

The basic principle of simultaneous bidirectional signaling is illustrated in FIG. 1. If unit A sends a pulse via cable 10 to unit B, part of the pulse reflects back to unit A from impedance discontinuities in connectors 21, 22, and impedance mismatch of the intended receiver 32 (and/or electro static discharge (ESD) suppression components (not shown)) at unit B. This results in only low bit rate signaling in simultaneous bidirectional links having connectors, as it is the case in all of the above-discussed applications.

Examples for and further information on high-speed links can be found, for instance, in "A 2.4 Gb/s/pin Simultaneous Bidirectional Parallel Link with Per-Pin Skew Compensation", Evelina Yeung, Student Member, IEEE, and Mark A. Horowitz, Fellow, IEEE, IEEE JOURNAL OF SOLID-STATE CIRCUITS, VOL. 35, NO. 11, NOVEMBER 2000, pp. 1619 and "Architecture and Design of a Simultaneously Bidirectional Single-ended High Speed Chip-to-Chip Interface", Robert Drost, SMLI TR-2002-107 February 2002.

Accordingly, one method to handle unwanted reflected signals on data connections is echo-cancellation. In FIG. 1, the signal driver 41 of unit A sends a pulse into the cable 10, but at the same time the same pulse is supplied to reference input pins of receiving comparator 31 by means of replica driver 51. The effect of the supplied pulse from the replica driver 51 to the receiving comparator 31 is illustrated for a single-ended signaling in FIG. 2 (left part of the Fig.).

In FIG. 2, by the signal from replica driver 51 the detecting level of the receiving comparator 31 is changed with an equal amount as the (send) pulse changes the signal at the output of signal driver 41. In this way, in principle, the receiving comparator 31 will not "see" the pulse sent by the signal driver 41 located at the same end of the cable 10. One remaining problem in such typical echo-cancellation system is matching of load coming from the cable 10 having connectors to the load seen by the replica driver 51. In particular, if the loads are not equal, the reference level of the receiving comparator 31 does not match to the signal sent into cable 10. Consequently, the difference (signal) is seen as signal by the receiving comparator 31 and thus is mixed with the intended signal sent from the opposite end of the cable, for example the unit B in FIG. 1.

Another even more difficult problem is formed by the signal reflected back from the other end of the cable from impedance discontinuities caused by, for instance, ESD protection circuits, connector capacitances and/or inductances. This reflected part was found as a serious problem, for example, in microwave link systems using simultaneous bidirectional signaling. Accordingly, there is a need for cable connections enabling high-speed serial simultaneous bidirectional communication.

SUMMARY

Therefore, certain embodiments of the invention relate to solutions for the above-discussed problems. In particular, certain embodiments provide a cable connection and a method of manufacture thereof enabling a high-speed serial simultaneous bidirectional signaling connection.

According to certain aspects, a cable connection is provided that may include at least one cable as a wire conducted signal interconnection between two cable module circuits connected to conductors of the cable at respective ends of the cable, wherein at least signal wires of the conductors of the cable are directly and permanent electrical connected at each end of the cable with respective contacts of the respective cable module circuit, wherein the cable module circuits are arranged for simultaneous bidirectional signaling via the cable connection.

According to another aspect, a similar cable connection may be used inside an electronic device, where electronic circuits of the electronic device are located in respective parts of a housing of the electronic device, wherein the parts of the housing of the electronic device are mechanical connected to each other such that the parts of the housing of the electronic device may be moved with respect to each other, and wherein the cable connection is going through or arranged inside the mechanical connection.

Accordingly to yet another aspect, an integrated circuit may include contacts for interconnection of the integrated circuit, which is a cable module circuit arranged for simultaneous bidirectional signaling via a cable connection; wherein the cable module circuit is adapted to be connected to a cable for a wire conducted signal interconnection via the cable with another cable module circuit connected to conductors of the cable at the other end of the cable; wherein at least signal wires of the conductors of the cable are to be directly and permanent electrical connected to the cable module circuit.

In other various embodiments, a method of manufacture includes cutting a cable to a required predetermined length;

fabricating integrated cable module circuits which are arranged for simultaneous bidirectional signaling via the cable; and connecting directly with a permanent method conductors of the cable at each cable end with respective contacts of the respective integrated cable module circuits; wherein in fabricating of the integrated cable module circuits input and output impedances of the integrated cable module circuits connected to conductors of the cable are matched to the respective cable impedance.

Other certain embodiments relate to a method of manufacture including fabricating an integrated cable module circuit, which is arranged for simultaneous bidirectional signaling via a cable connection, wherein at least respective input and output impedances of the integrated cable module circuit are matched to a cable impedance which is predetermined by a cable to be connected to the integrated cable module circuit.

With regard to the aspect of having conductors of the cable connected into the integrated cable module circuit (or cable module integrated circuit (IC)), herein "directly" may mean, for example, that at least the signal wires of the conductors of the cable connection are directly bonded by a suitable method or process, for instance, such as ultrasonic or laser bonding to bonding pads at the cable module IC. In case of very thin signal wires, a separate support board may be used for the signal wire(s), which can, for instance, be connected or bonded, respectively, by gold or aluminum wire bonding from the support board to respective bonding pad(s) of the cable module IC. Further, "directly" may also include cases where the signal wire of the cable connection is connected to a contact, such as a contact pad, of a printed wiring board (PCB), which may be a separate small PCB, from where the electrical or signal connection is made with the cable module IC, for which, for example, traditional or flip chip (FC) IC packaging can be used. Furthermore, as support board may be, for example, also be understood a lead frame of a conventional IC packaging to which the cable module IC is interconnected, where contact pads of the lead frame are used for connection to the at least signal wires of the cable connection.

Another aspect relates to the kind or type of cable for the cable connection, which may be comprised of a shielded pair cable, which, thus, may be used for simultaneous bidirectional differential signaling. Alternatively, the cable connection may be made of a coaxial cable. In that case, also a pair of coaxial cables can be used, which allows for simultaneous bidirectional differential signaling.

Another aspect relates to the cable module circuit, each of which in one embodiment comprises sending and receiving means for sending and receiving a wire-conducted signal via the respective cable connection, such as a transmitter-receiver unit or transceiver unit for short.

Each of the cable module circuits may be precisely adapted to respective electrical properties of the cable, such as the impedance and/or used cable length. Accordingly, by matching of input and output impedances of the cable module circuits, which are connected to conductors of the cable, to the respective cable impedance reflections of a signal conducted via the cable connection may potentially be reduced. Impedance matching may be made to the cable module circuits, such as the afore-mentioned transceiver units, as a whole including potentially used mechanical connection components like printed wiring boards and integrated circuit (IC) packages. The transceiver units of the cable module circuit may be designed to provide multi-gigabit bidirectional data transmission via the cable connection.

In another development, when the cable comprises an outer conductor, the outer conductor may be connected to a ground potential of the cable module circuit at least at one end of the cable. Additionally or alternatively, when the cable may be provided with an outer conductor having a predetermined thickness, which may be adapted such that electronic discharge pulses of a certain energy level are attenuated such that dedicated electronic discharge protection (ESD) circuit can be limited or even omitted at the cable module circuit. The cable outer conductor properties are described by a term known as "surface transfer impedance". In short, "surface transfer impedance" is the voltage drop on the inside of the shield divided by an electrical current flowing on the external surface of the cable. In typical coaxial cables, the surface transfer impedance may be about 1 mΩ (milliohm) to tens of milliohms. Accordingly, with about 1 mΩ surface transfer impedance a ESD signal in the range of 10 kV may be attenuated to about $1/1000$ thereof, that is about 10 V that would be tolerable by normal integrated circuits having about 2 kV ESD tolerance, which may be required for manufacturability thereof.

In certain embodiments, the cable module circuits are implemented as integrated cable module circuits. Then, at least one of the contacts (or contact means) at the integrated cable module circuit can be a contact pad for a bonding interconnection. Alternatively or additionally, at least one of the contacts (or contact means) at the integrated cable module circuit may be at least one of a direct bump on a contact pad, a bump on a repassivation or redistribution pad, and a bump on a thick repassivation or redistribution pad. Accordingly, at least the signal wires of the cable can then be directly and permanent electrically connected to some of these contacts.

In a further development, at least one cable of the cable connection is fixed to a support board, which can be a separate support board with respect to the cable module circuit or with respect to the circuit board to which the cable module circuit is mounted. The support board may also be the circuit board on which the cable module circuit is mounted. Also (as mentioned above) a lead frame to which the integrated cable module circuit is interconnected may be understood as a support board in this context. At the support board at least the signal wire of the cable is then directly and permanent (inter) connected from the support board to a respective contact (or contact means) of the integrated cable module circuit. This connection may comprise a bonding wire or any other suitable electrical connection means. Additionally, the cable module and the direct and permanent interconnection to the cable can at least at one end of the cable be sealed and/or protected by cover means or a cover made by or of suitable molded material or hardened material, such as a epoxy shielding, a molded resin or alike.

Alternatively or additionally, the respective cable module circuit may be packed at least at one end of the cable connection into a circuit package, which may then comprise connection means for connection of the cable module to a circuit board. In this case, the contacts or connection means can be at least one of a connection pin, a connection bump, a connection ball or a combination thereof for a permanent mounting of the packed integrated circuit to a circuit board.

The packaging can be arranged for surface mounting (SMT) mounting or for through hole mounting processes. Again, at least one signal wire of the cable connection may then be directly and permanent connected to the cable module circuit via a printed wiring board having respective electrical connections to the contacts of the packed integrated cable module circuit.

As it regards the packaging of the integrated cable module circuits, one option is small outline IC (SOIC) package, also known as SOJ. The SOIC packages may enable SMT performance characteristics such that their use may fit easily to many or even all SMT processes and lines. Alternatively or additionally, the integrated cable modules circuits may be arranged in its packaging or even unpacked arranged in a so-called flip chip (FC) arrangement, which is not a specific package like the mentioned SOIC. Flip chip arrangement refers to the orientation of electrically connecting the chip with the integrated cable module circuit to the package carrier or the contacts or contact means.

In cases where a package carrier is used, which may be a substrate frame, a lead frame, or a frame consisting of other material(s), the carrier provides for the connection from the chip to the exterior of the package. As with conventional packaging, the interconnection between the chip and the package carrier may be made using bond wires. The chip may be attached to the carrier face up, and then a wire may be bonded first to the chip, then looped and bonded to the carrier. Wires are typically 1-5 mm in length, and 25-35 µm in diameter.

In another example, the interconnection between the chip and carrier in flip chip arrangement, interconnection may be made through conductive contact balls, so-called bumps, that are placed directly on the chip surface to contacts of the integrated circuits, which may be the above-mentioned implementation as bump on a contact pad, bump on a repassivation or redistribution pad, and a bump on a thick repassivation or redistribution pad. The bumped chip can then flipped over and placed or mounted in a face down arrangement, namely the flip chip arrangement, with the bumps connecting to the carrier or the circuit board directly. A bump is typically 70-100 µm high, and 100-125 µm in diameter. The FC connection may generally be formed in using solder or using conductive adhesive.

Application of the FC arrangement for the integrated cable module circuits may potentially provide for reduced signal inductance due to the interconnect being shorter in length. Hence, the inductance of the signal path may be reduced, which can improve signal quality in high-speed communication. Further, also power/ground inductance(s) may be reduced. By using FC arrangement interconnects to power and ground potential can be brought directly into the core of the chip, rather than having to be routed to edges of a carrier thereof. This results in a further decrease of noise of the core power, which may potentially improve the performance of the silicon. Furthermore, the entire surface of the chip can be used for interconnection, possibly resulting in higher signal density. Moreover, the size of the chip can be reduced since chip size is no longer determined by the edge space required for bonding pads, potentially allowing for smaller integrated cable modules by which silicon may be saved.

In a further development, the connection means may be a connector configured/adapted for connecting the packed integrated cable module circuit to a corresponding connector port located at a circuit board.

The connection means to the cable module circuits may also comprise connection contacts for data input and output to the cable module and power supply contacts for providing electrical power to the cable module circuit.

In one application, the cable connection may be used for a simultaneous bidirectional signaling interconnection between a mobile electronic device and a periphery device thereof. In a certain application, the mobile electronic device may be a mobile phone and the periphery device is a headset with a display, a camera module or a combination thereof. However, it is worth noting that the disclosed simultaneous bidirectional signaling interconnection may be used for interconnection between many kinds of electronic devices and/or modules.

In another certain application, the mobile electronic device may be a portable computer device, such as a laptop or a personal digital assistant, and the cable connection may be used for a simultaneous bidirectional signaling interconnection between a graphic display and a respective display of the portable computer device.

In cases where the cable connection is used inside an electronic device, the electronic circuits of the mobile electronic device may be located in respective parts of a housing of the mobile device, wherein the parts of the housing of the mobile device are mechanical connected to each other such that the parts of the housing of the mobile device may be moved with respect to each other, and the cable connection is going through or arranged inside the mechanical connection for interconnecting the electronic circuits of the mobile electronic device may be located in respective parts of a housing of the mobile device. For instance, when the mobile electronic device is a mobile or portable computer, the cable connection may connect the main board of the computer to a display of the computer, which may be attached to the mobile device by means of a hinge or sliding mechanics or other suitable mechanical movable (rotatable, rockable, pivotable, turnable or any combination thereof) connection.

In certain possible applications, the mobile electronic device is a mobile phone. The cable connection may then be an interconnection for Mobile Industry Processor Interface alliance M-PHY protocol. In such applications, each of the cable module circuit may comprise multi-gigabit bidirectional transceivers.

As it regards the method of manufacture, the method may further comprise packaging the integrated cable module circuits into a package to form a cable connector module at each end of the cable. It is worth noting that the cable connection can be manufactured as an entity by one manufacturing line or process. However, as long as the principles herein disclosed are considered, it is also possible to have the integrated cable module circuits made by a certain manufacturer and the required cable to be used in a certain application is provided by a cable manufacturer. Additionally, the length of the cable to be used, which may be indicated by the intended application, has impact on electrical characteristics of the cable, such as cable impedance, to which the integrated cable module circuits are to be adapted.

The method may also comprise packaging the integrated cable module circuits into a housing having a connector for attaching the cable module to a respective port connector at a circuit board.

During manufacture of the cable connection, signal wires of the cable connection may be direct bonded to contact pads of the integrated cable module circuits. In one embodiment of the method, the integrated cable module circuits arranging in a flip chip arrangement; and contacts of the integrated cable module circuits are provided with contactable bumps or pins. Then, the conductors of the cable at each cable end can be connected to the respective contactable bumps or pins.

In certain embodiments of the method, the cable is fixed in a through hole of a printed circuit board; and at least the signal wire of the conductors of the cable are connected at the other side of the printed circuit board to the respective contactable bumps or pins of the respective integrated cable module circuit.

Basically, the cable connection can be used inside or outside an electronic device, where electronic circuits of the mobile electronic device are located in respective parts of a housing of the mobile device. Parts of the housing of the mobile device may be mechanical connected to each other such that the parts of the housing of the mobile device can be moved with respect to each other. The cable connection can be used running through or arranged inside the mechanical connection.

By arranging a high-speed, such as a multi-gigabit, bidirectional transceiver circuit inside a cable connector module to which the cable for the connection is directly connected, additional loads, for example caused by ESD suppression components, may be reduced or even eliminated from the cable connecting modules/units. Thus, required impedance matching may be designed to prevent too large of a part of the signal transmitted via the cable connection from reflecting back into the original source of the signal, such as pulse(s).

Further, by connecting the cable permanent and as directly as possible to/into respective integrated transceiver circuits, the connection can be well protected from all kind of disturbance, such as, for example, human touch or over-voltages. Thus, additional loads from ESD-protection, which would generate reflections, are not required. As a result, very high simultaneous bidirectional bit rates may potentially be achieved by this "clean" interconnection between electronic units or modules.

As it regards manufacture of the cable connection of the invention, the provided method can make the connection from the driver circuit into the cable easily controllable. In other words, the cable assembly manufacturer creates the connection directly from driver/transceiver into the cable with a permanent method, that is, without any detachable connectors. In this way, it may be easier to tune comparator reference input and cable loads equal to each other. Furthermore, because additional components might not be required and the cable assembly manufacturer controls impedance of the cable, thus matching of the transceiver's input and output impedance to the cable impedance may become an easier task. Semiconductor technology in the bidirectional transceiver may be used for better high-speed performance and smaller manufacturing tolerances than would normally be possible in typical IC's used in mobile terminals. Higher bit rates and better impedance accuracy might even be possible than with typical mobile terminal IC's.

Another example of a cable connection configuration could be an extension of the MIPI Unified Protocol interface outside a mobile terminal to get connection to, for instance, multimedia display/camera unit in a "head set", for example. Unified Protocol, or UniPro for short, for the D-PHY is aimed at linking a wide variety of peripherals that require high bandwidth, including TV receivers and Wi-Fi devices. UniPro may act as a single protocol covering cameras, displays and other systems, but it is still in development.

Another example for an application could be extension of Universal Synchronous Bus (USB) interface to new generation making simultaneous bidirectional signaling as an additional option (which could support also 480 Mbps high-speed mode), which may potentially make doubling of bandwidth possible without increasing bit rate. With a high-quality well-matched cable in this example, increasing of USB bandwidth may also be possible. Moreover, the distance from the cable-connection to the transmitter-receiver (transceiver) logic may be made shorter that in some cases even single-ended signaling might be possible.

Accordingly, one advantage of certain embodiments is the possibility of elimination as many as half of the signal wires from wire-conducted interconnections comprising interconnecting cables. An additional advantage may be the possibility of using very small signal amplitude and very high bit rates.

BRIEF DESCRIPTION OF THE DRAWINGS

Other objects and features will become apparent from the following detailed description considered in conjunction with the accompanying drawings. It is to be understood, however, that the drawings are designed solely for purposes of illustration and not as a definition of the limits of the invention, for which reference should be made to the appended claims only. It should be further understood that the drawings are merely intended to conceptually illustrate the structures and procedures described herein.

DETAILED DESCRIPTION OF EMBODIMENTS

In the following description of the various embodiments, reference is made to the accompanying drawings, which form a part hereof, and in which is shown by way of illustration various embodiments in which the invention may be practiced. It is to be understood that other embodiments may be utilized and structural and functional modifications may be made without departing from the scope and spirit of the present invention.

Figure 1:
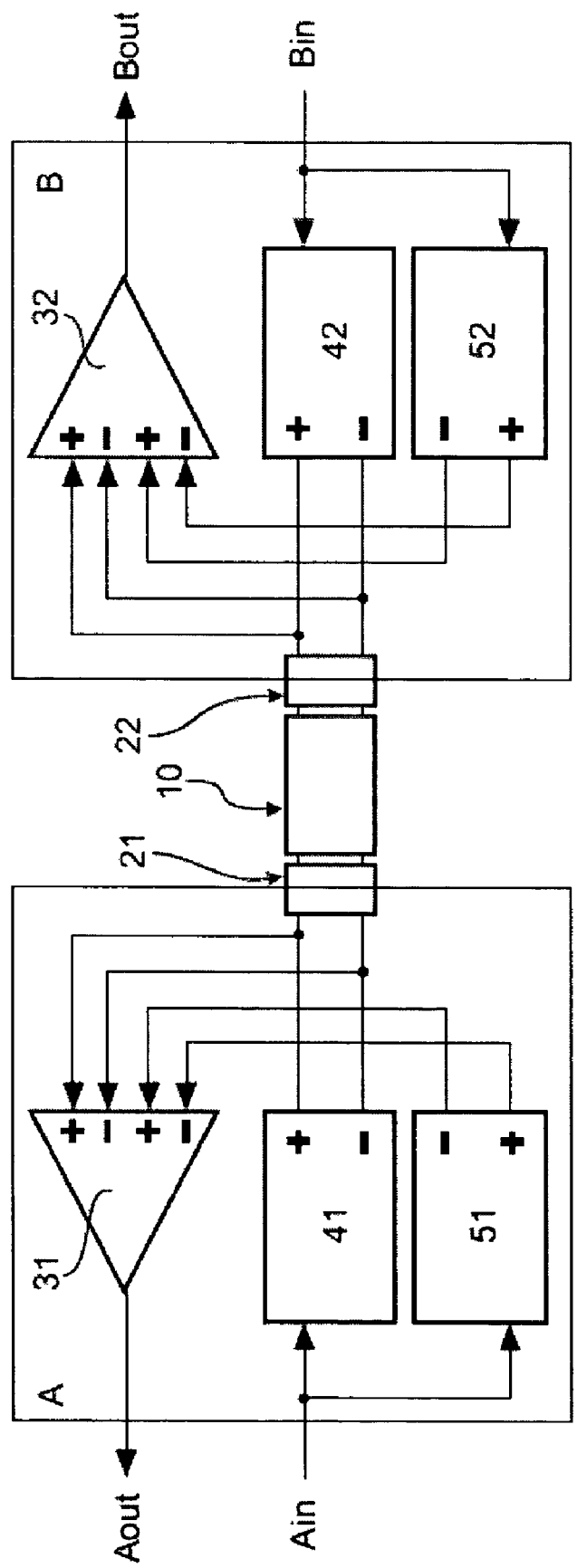
FIG. 1 illustrates the basic principle of simultaneous bidirectional signaling infrastructure, in accordance with certain aspects of the invention.
Figure 2:
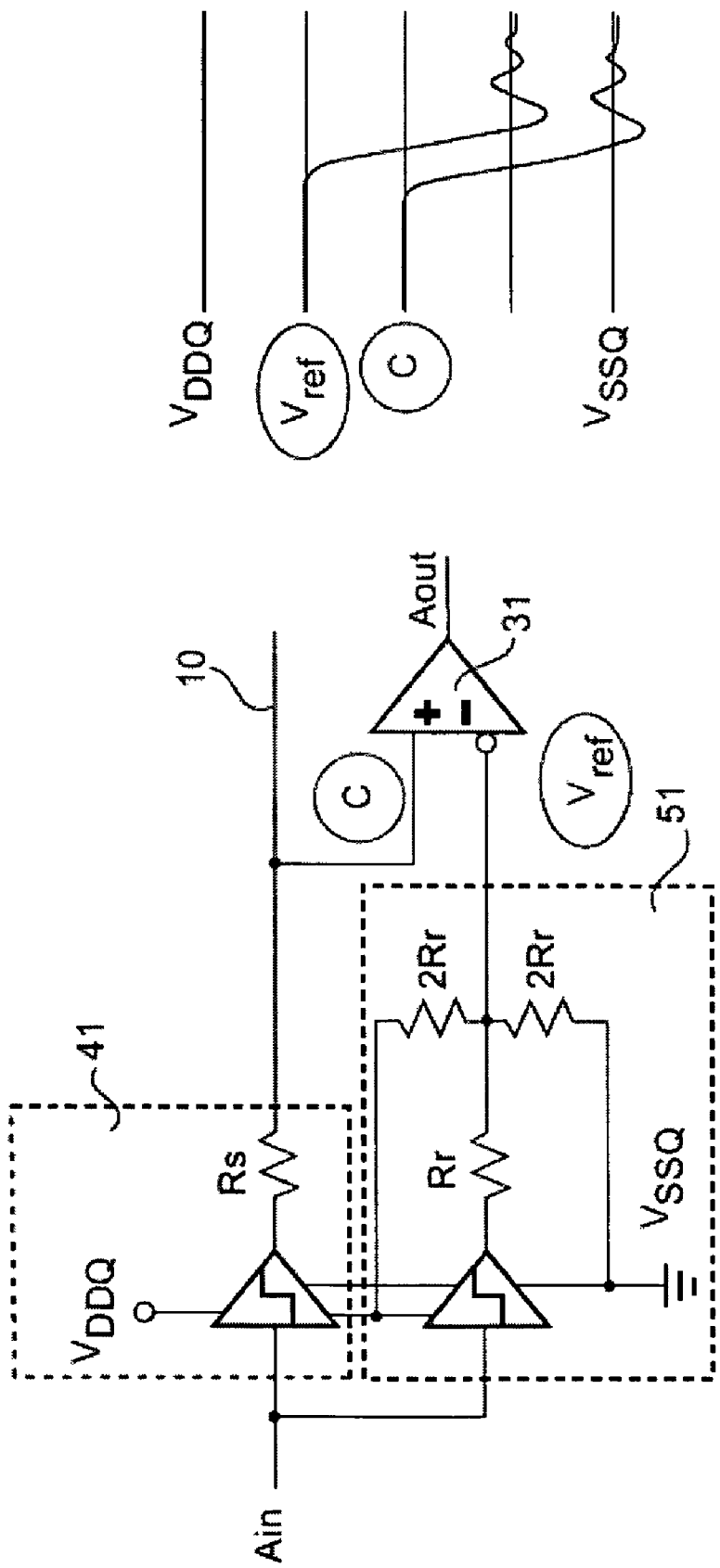
FIG. 2 illustrates echo-cancellation in the connection of FIG. 1.
Figure 3:
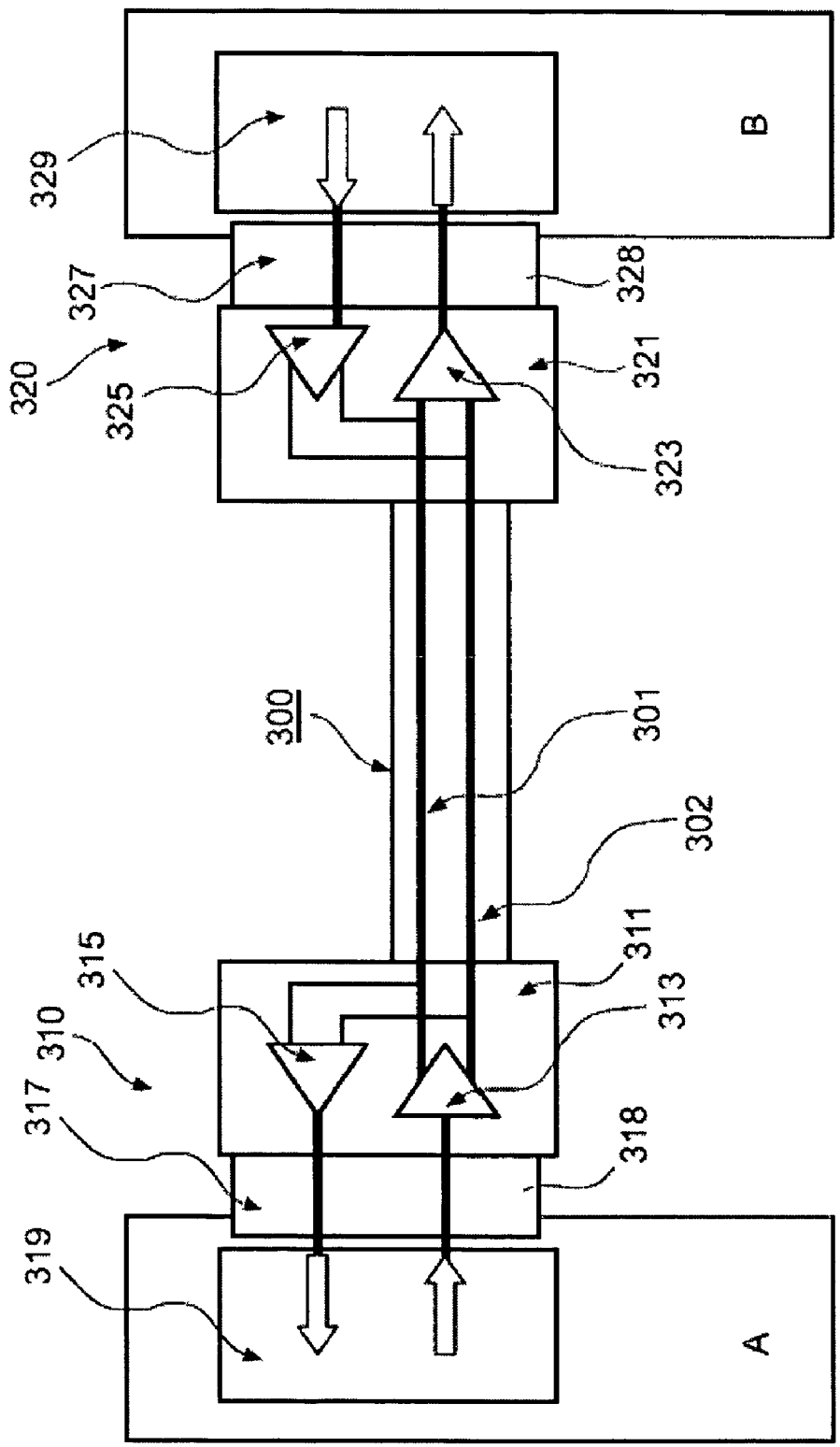
FIG. 3 shows an active bidirectional cable connection according to certain aspects of the invention.

Now reference is made to FIG. 3, which shows a schematic block diagram of the active bidirectional cable connection according to the proposed configuration principle of the present invention. Basically, there is a circuit or a unit A and a circuit or a unit B, which are interconnected by means of a wire conducted data connection 300. The wire conducted data connection 300 is comprised of two coaxial cables 301, 302 as a differential wire pair. At each end of the wire conducted data connection 300, the coaxial cables 301, 302 are directly and permanent connected to respective cable modules 310, 320.

In this example, the respective cable modules 310, 320 at each end of the wire conducted data connection 300 may comprise at least the required circuit 311, 321 for transmitting and sending data over the differential wire pair formed by the two coaxial cables 301, 302. Accordingly, the cable modules 310, 320 may comprise respective signal driver 313, 323 for supplying a signal to be sent to the other end of the wire conducted data connection 300. Further, the cable modules 310, 320 may comprise respective receiving comparators 315, 325, which are adapted for detecting a signal, send via the wire conducted data connection 300 from the cable module at the other end. The combination of the respective signal drivers 313, 323 and receiving compactors 315, 325 form respective transceiver units integrated in the respective cable modules 310, 320.

The cable modules 310, 320, to which the coaxial cables 301, 302 may be directly and permanent connected, having connection means 317, 327 to the circuit of the units and B, respectively. In this example, connection means 317, 327 may involve conventional interconnection methods and designs, such as those known from surface mounted electronic components as well as packed integrated circuits. In these cases, the cable connection may be mounted on the respective PCB parts of the electronic device to be interconnected.

According to one embodiment, it is also possible have connectors as connection means 317, 327. One such example is depicted in FIG. 3 by reference signs 318 and 319 for cable module 310 as well as by reference signs 328 and 329 for cable module 320, where reference signs 318, 319 and 328, 329 represent respective miniaturized connector pairs, which are available in different types.

One aspect of this cable interconnection relates to electrically and mechanically connecting the respective used wire or cable type directly and permanent to the respective integrated circuit cable of the respective module 310, 320. For instance, the inner conductor wire and the outer conductor can be bonded to respective connection pads provided at the integrated circuit of the respective cable modules, which may serve as an integrated interface in/to the cable interconnection.

Figure 4:
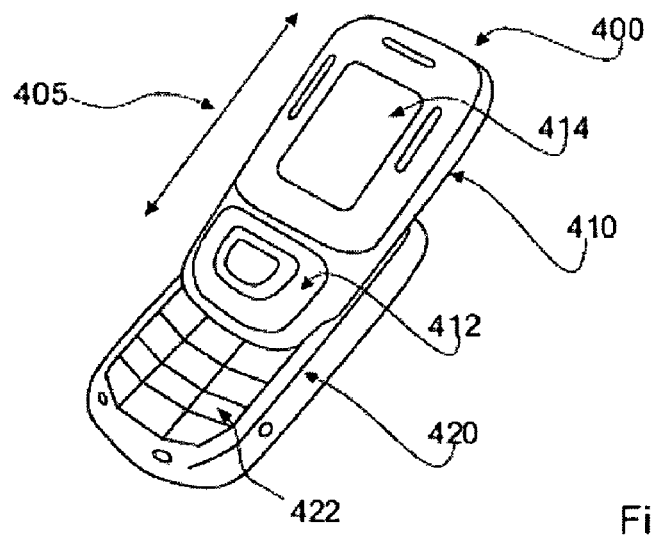
FIGS. 4A, 4B show an embodiment of the application of a cable connection in a mobile terminal device, according to certain aspects of the invention.
Figure 4:
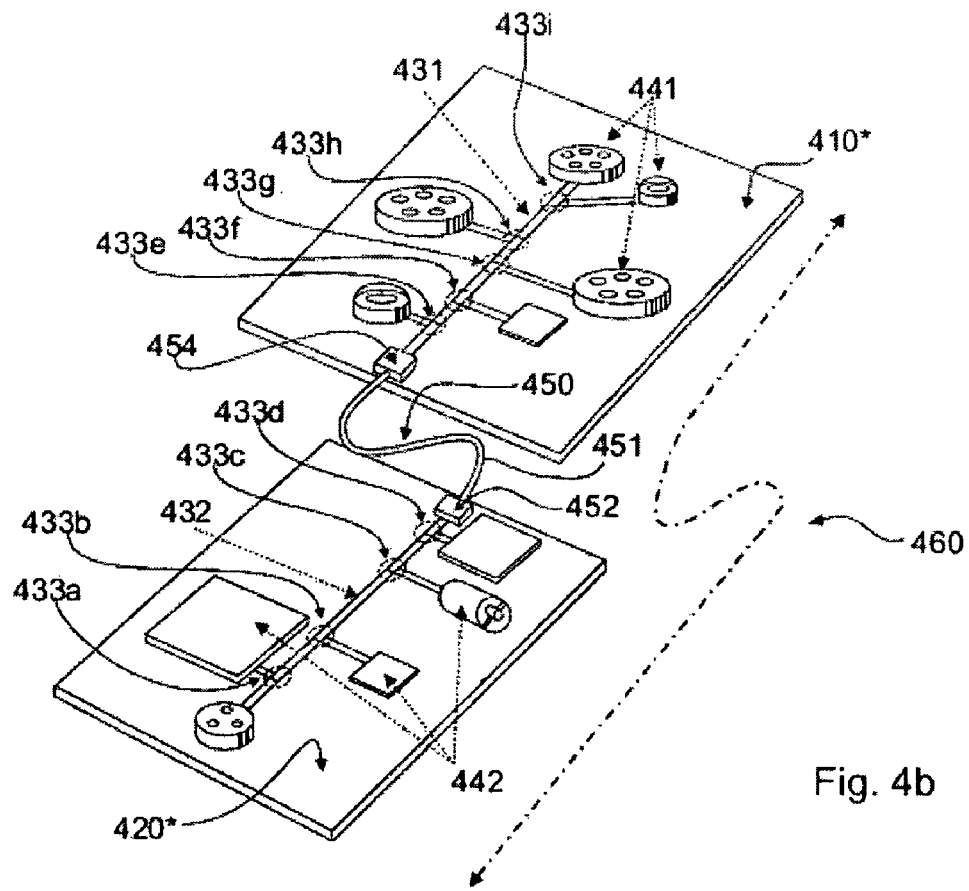

Now reference is made to FIGS. 4a and 4b, in which an illustrative use case/application for a wire conducted data connection or cable interconnection is shown. Specifically, FIG. 4a shows an illustration of a mobile terminal or mobile phone 400 (or mobile for short), which is comprised of two parts 410, 420. FIG. 4a includes an indication of the phone's size by reference sign 405 pointing to an arrow, which may be in closed conduction about 7 cm. This indication 405 may be helpful for understanding the cable length of cable connection 450 discussed below in connection with FIG. 4b. An upper part 410 contains, e.g., a small number of keys 412 and a display 414, and the lower part 420 contains, e.g., a keypad 422 with several conventional keys typically known in the area of phones. The two parts 410, 420 are mechanically connected together by means of a sliding mechanism, such phones are therefore also known as "slider phones". The mechanical aspects of the connection will not be focused here in more detail. As already mentioned above, in conventional techniques, phones having two or more parts or components which are arranged moveable to each other may require large numbers of lanes in the electrical interconnection(s), which may result in the discussed electronic disadvantages as well as the high mechanical stresses during the life time of the phone.

Now with reference to FIG. 4b, a illustrative data connection is shown between two parts 410, 420 of the mobile device shown in FIG. 4a. The data connection in FIG. 4b connects respective printed circuit boards (PCB), modules 410*, 420* with electronic circuit which are in each respective part of the mobile phone. The electronic circuit and components on the modules 410* and 420* may comprise a multi-point bus, comprising portions 431, 432 to which respective functional components 441, 442 are physically connected together by respective signal wires. It is noted that, alternatively, instead of a multipoint bus on both modules 410*, 420*, it may also be possible to have a UniPro network, where all connections would be point-to-point connections between respective nodes 433a, 433b, . . . , 433h, 433i, which are illustrated as dotted circles in FIG. 4b. In case of such a UniPro network, there may be a switch-node at all interconnections.

It goes without saying that detailed information on and description of the electronic parts and functional components of the mobile phone 400, which are merely sketched as examples in FIG. 4b, are not required herein. Further, it will be appreciated that the application of the cable interconnection in a mobile phone described herein is a general example, and is not intended to restrict the invention or its application thereto.

In FIG. 4b, the cable connection 450 may be comprised of a single coaxial cable 451 that provides for simultaneous bidirectional signaling. The electronic interconnection may provide for a reliable electronic interface between two functional parts of the phone, the modules 410*, 420*. Additionally, due to its robust configuration, the cable connection may be able to better withstand the mechanical stress from use during the expected/desired lifetime of the product.

Further, the cable connection may provide an active high-speed bidirectional interconnection for data exchange between the modules 410* and 420*. On each PCB of the modules 410* and 420* is a respective cable module 452, 454 (each of which may comprise the respective integrated cable module circuit) which may be directly and permanent connected to the coaxial cable 451.

As discussed above, the cable manufacturer may manufacture the cable connection 450 as a unit. That is to say, the coaxial cable may be assembled together with the cable modules 452, 454 at each end. In one example, the cable assembly may be made from a single coaxial cable. The outer conductor of the coaxial cable may be made thick enough to provide enough shielding for a single-ended signal transmission. Further, by the cable assembly forming a solid structure, the coaxial cable outer conductor can be connected to transceiver ground in the cable modules 4521, 454, in a way which may provide for low inductance (low transfer impedance) so that single-ended signaling in the range of Gb/s rates may be possible.

Accordingly, such a single coaxial cable may be able to replace optical fiber connections, such as those conventionally used in certain mobile devices. For example, single-cable signaling may require that the M-PHY, under specification in MIPI, will be ready. Thus, certain embodiments may use the well-controlled interconnection described herein to allow for similar bit rates as conventional optical signaling techniques. In addition, normal low-speed CMOS signaling may potentially be made easier and more power efficient in comparison to optics. A single coaxial cable may be flexible enough to tolerate rotation and bending. In this example, the connection may also be an external cable connection, such as a connection between a mobile device and a "headset" with, for example, near-eye display.

Now with reference to FIG. 5 to 8 several embodiments of the direct and permanent connection of at least one signal wire of a cable connection to a respective cable module circuit are shown. The following discussion and descriptions of these embodiments are not intended as limitations of the invention, since many details and/or aspects of a certain embodiment may be combined in further embodiments which are not shown or described herein.

Figure 5:
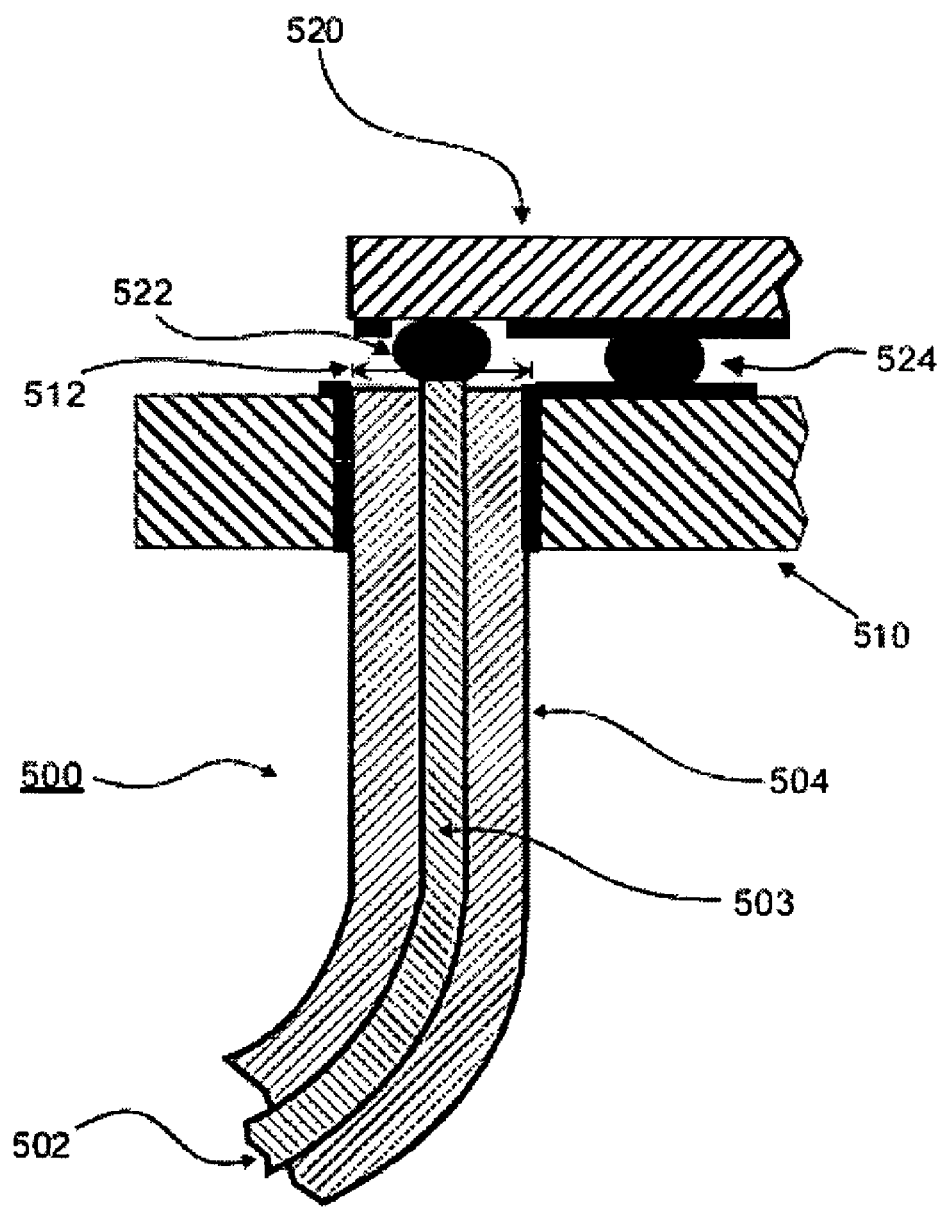
FIG. 5 shows a first embodiment of a direct and permanent connection of a signal wire of the cable connection to a contact of an integrated cable module circuit in flip chip arrangement, in accordance with certain aspects of the invention.

In FIG. 5, an embodiment of the direct and permanent cable connection is illustrated, in which for the cable a coaxial cable 500 is used. The coaxial cable 500 comprises an inner conductor 502, which is used as the signal wire 503, and an outer conductor 504, which may be used for shielding proposes. The coaxial cable 500 may be fixed to a printed circuit board (PCB) 510, which may be the circuit board to which the cable connection is to be established. In the PCB 510, there may be at least one through-hole 512, to which the coaxial cable 500 is fixed. In this example, the fixation may be implemented by soldering the outer conductor 504 to conductor material of the PCB 510 at the through-hole 512, the diameter of which is indicated by the arrow 514 and may be designed to correspond substantially to the outer diameter of the cable 500. Accordingly, by this configuration the outer conductor 504 can be connected to ground potential of the circuit on the PCB 510.

In this example, the direct and permanent connection of the signal wire 503 to a contact of a cable module circuit 520 is arranged in a flip chip arrangement. Thus, the signal wire 503 of the cable 500 is directly connected to the respective contact of the integrated cable module circuit 520 by means of a signal bump 522. Similarly, the ground contact of the integrated cable module device 520 may be connected via a respective ground bump 524 to a ground conductor 514 of the PCB 510, which may also be connected with outer conductor 504 of the cable 500. The whole arrangement may finally be covered by a molded resin, an epoxy, or suitable plastic material, in order to provide for protection and additional support (not shown in FIG. 5).

Figure 6:
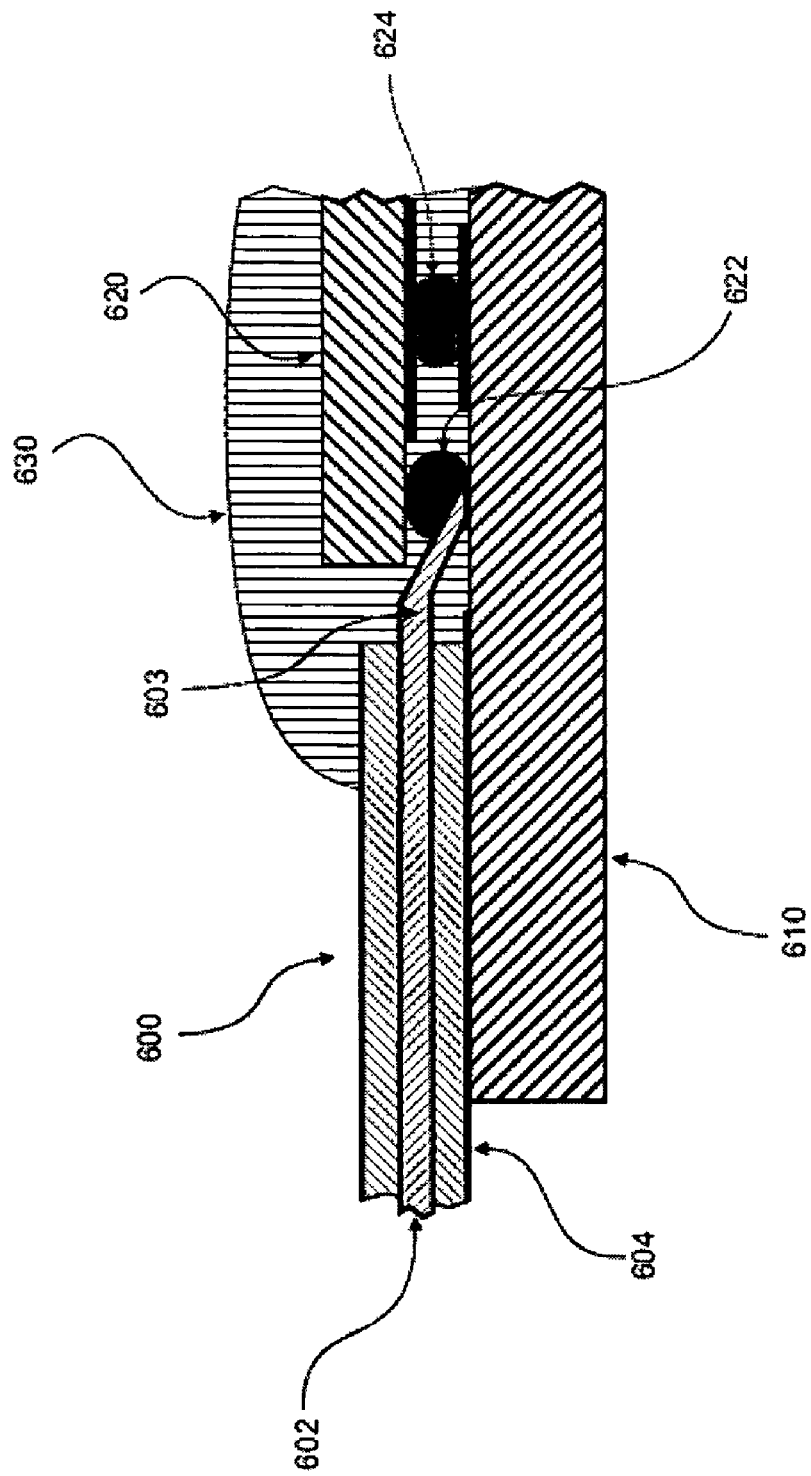
FIG. 6 shows a second embodiment of a direct and permanent connection of a signal wire of the cable connection to a contact of an integrated cable module circuit in flip chip arrangement, in accordance with certain aspects of the invention.

Now with reference to FIG. 6, in which a second embodiment for the direct and permanent cable connection is illustrated, a coaxial cable 600 is once again used. The coaxial cable 600 comprises the inner conductor 602 used as the signal wire 603 and the outer conductor 604, which may be used for shielding proposes. The coaxial cable 600 may be fixed on top of a printed circuit board (PCB) 610, which is, for example, one of the circuit boards of FIG. 4b, to which the cable connection may be established.

The integrated cable module circuit 620 may be similar to the one described with FIG. 5. For example, the chip or die with the integrated cable module circuit may be arranged in a flip chip configuration as shown, and the required electrical contacts may be again provided by respective bumps (e.g., a signal bump 622 for connection with the signal wire 603 and a ground bump 624 for supply of a ground potential to the cable module IC). The direct and permanent connection of the signal wire 603 and the signal bump 622 may be established at the same time, for example, when the integrated cable module circuit 620 (cable module IC) is surface mounted in its turned over orientation on the PCB 610. Thus, a direct and permanent connection between the signal wire 603 and the input and/or output of the integrated cable module circuit 620 may provide the properties required for good signal transmission. Additionally, the whole arrangement is protected by a cover 630 (for example, of a molded resin or an epoxy material) for shielding and protecting the connections, and for additional fixation of the cable 600.

Figure 7:
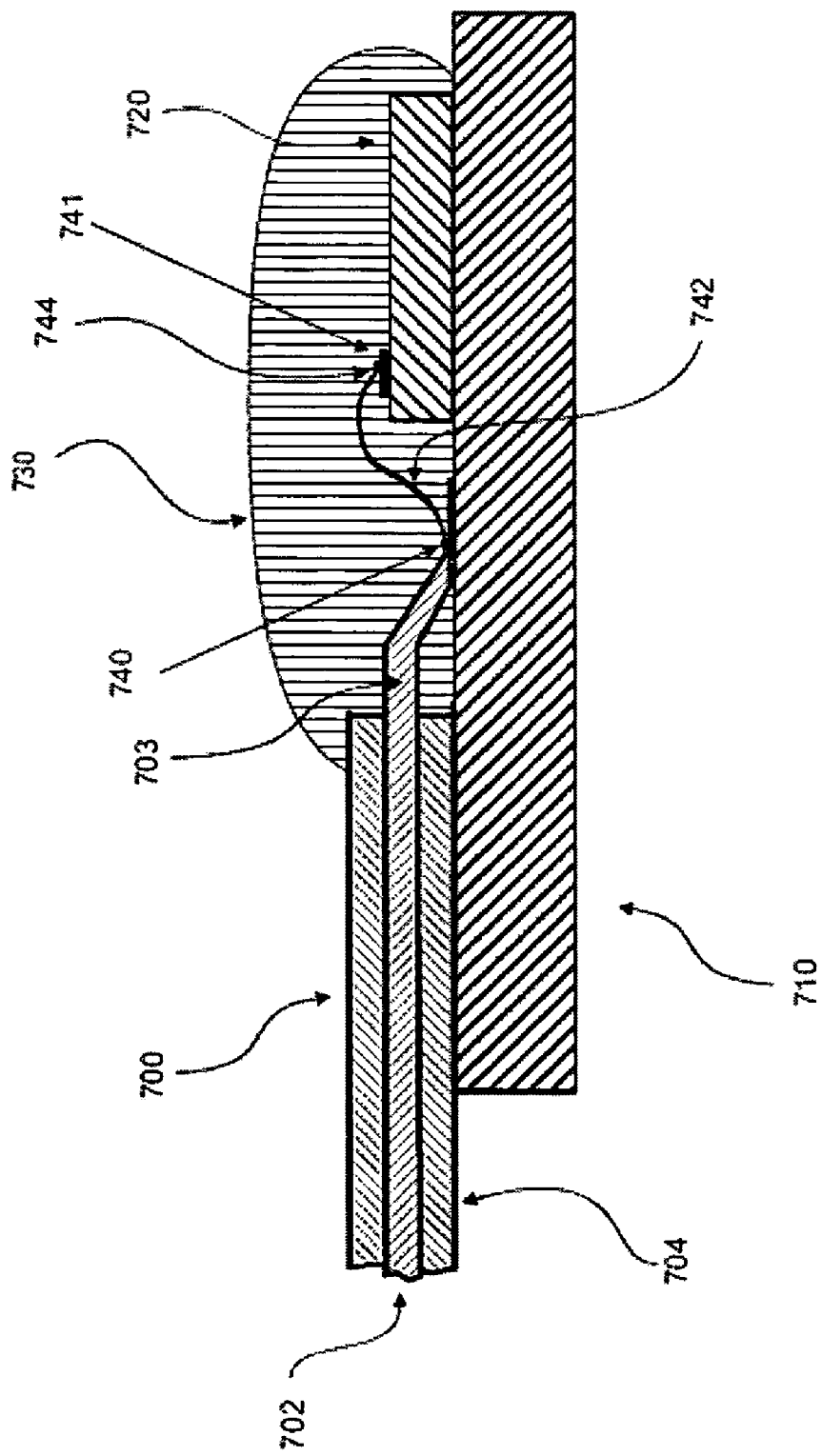
FIG. 7 shows a third embodiment of the direct and permanent connection of a signal wire of the cable connection to a contact of an integrated cable module circuit, in accordance with certain aspects of the invention.

Now with reference to FIG. 7, a third embodiment is shown illustrating a direct and permanent cable connection in which a coaxial cable 700 is used. In the following description, only the differences to the embodiments of FIGS. 5 and 6 are described in detail for sake of brevity. In this example, the inner conductor 702 (signal wire 730) and the outer conductor 704 of the coaxial cable 700 are attached/fixed to the printed circuit board (PCB) 710. On the PCB 710, the chip or die with integrated cable module circuit 720 may be placed in a conventional manner with the contacts in upside orientation with respect to the upper side of the PCB 720. On the PCB 710, between the chip with the integrated cable module circuit 720 and the coaxial cable 700 is located a contact pad 740, to which the signal wire 703 of the coaxial cable 700 is connected, for example, by soldering or ultrasonic/laser bonding. The direct and permanent connection between the signal wire 703 and a contact pad 741 at the integrated cable module circuit 720 may be established by a bonding wire 742. In this example, the whole arrangement is protected by a cover 730 of molded resin or an epoxy material for shielding and protection of the connections, as well as for additional fixation of the cable 700.

Figure 8:
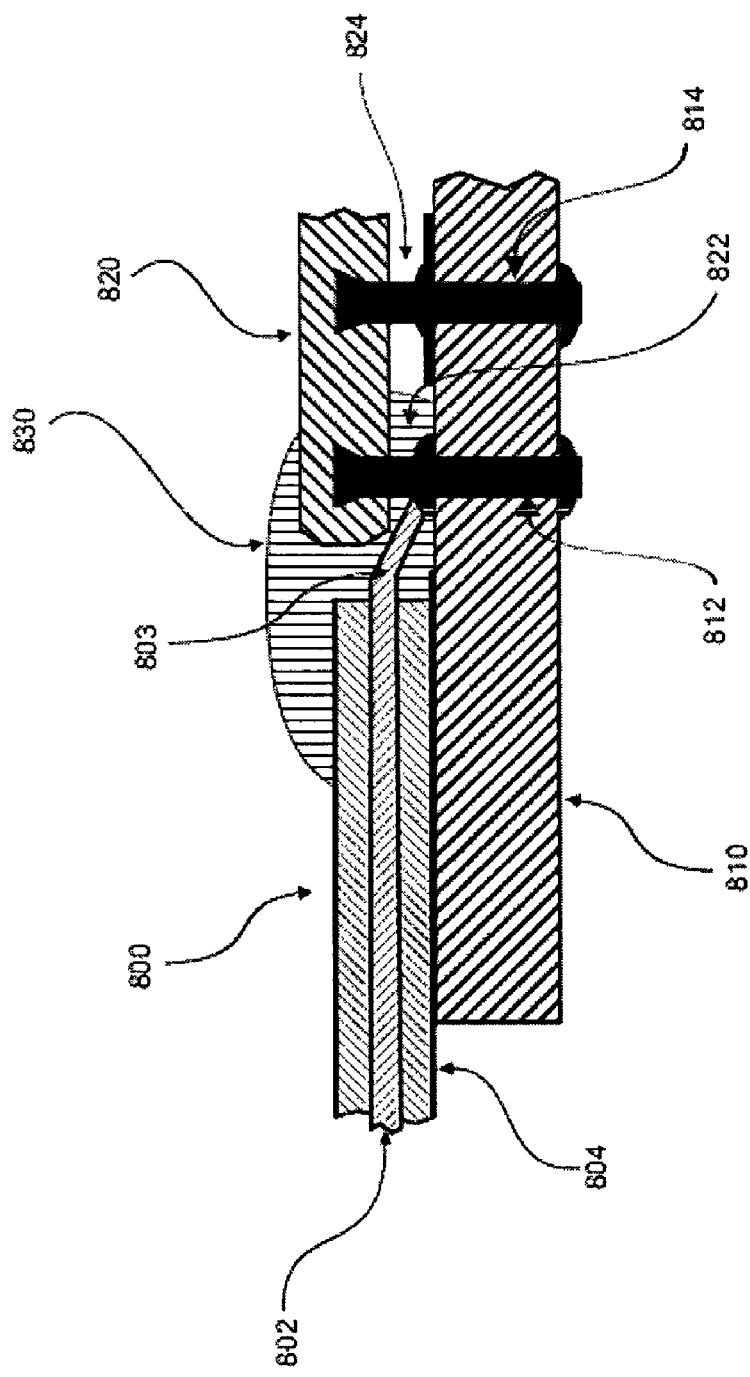
FIG. 8 shows a forth embodiment of a direct and permanent connection of a signal wire of the cable connection to a contact of a packed integrated cable module circuit, in accordance with certain aspects of the invention.

Now with reference to FIG. 8, an embodiment of the direct and permanent cable connection is illustrated using a coaxial cable 800. The coaxial cable 800 may comprise an inner conductor 802 used as the signal wire 803, and an outer conductor 804 shielding the signal wire 803. The coaxial cable 800 may be attached/fixed to a printed circuit board (PCB) 810, on which a SOIC packed cable module circuit 820 may be mounted in a through-hole mounting manner. In the PCB 810, there may be a required number of through-holes corresponding to the number of pins of the SOIC packed cable module circuit 820. In FIG. 8, there is a through-hole 812 for the pin to which the signal wire 803 of the coaxial cable 800 may be directly and permanent connected, and a through-hole 814 for the ground contact pin 824 of the SOIC packed cable module circuit 820.

In the illustrative embodiment of FIG. 8, a further fixation of the cable 800 may be made by soldering of the outer conductor 804 to a conductor material of the PCB 810. Accordingly, the outer conductor 804 may be connected to ground potential of the circuit on the PCB 810 for better shielding.

In this embodiment, the signal wire 803 is permanently connected to a contact of a small outline integrated circuit (SOIC) packed cable module circuit 820 (e.g., packed into an SOIC packaging). Here, the signal wire 803 of the cable 800 is directly and permanently connected to the respective contact of the SOIC cable module 820 by means of a signal contact pin 822. Additionally, the interconnection of the signal wire 803 to the SOIC cable module 820 may be covered by a molded resin, an epoxy, or suitable plastic material, in order to provide for protection and additional support.

In yet another embodiment (not illustrated), the cable 800 may be attached or fixed to the opposite side of the PCB 810. In this example, the connection of the signal wire(s) 803 may be established on the cable side of the PCB 810. Additionally, the signal wire of the cable 800 may be inserted into the respective through-hole of the PCB 810 (e.g., similarly to FIG. 5), and connected by soldering or any other suitable method or process to the respective pin of the packed integrated cable module circuit 820.

With respect to FIGS. 7 and 8, an additional possibility is available for connecting the signal wire(s) of the cable 800 in/into the cable module circuit fabricated on a silicon chip/die. In FIG. 8, the integrated cable module circuit is packed in a "conventional" IC packaging, such as a SOJ or SOIC packaging. As described above the chip with the integrated cable module circuit can be arranged in an up-side orientation within a lead frame, which provides required contact pads for interconnection. That is to say, the module circuit may be interconnected with the lead frame pads, for example, by bonding wires. This situation corresponds roughly the embodiment described in FIG. 7, in which the contact pad 740 is located on the lead frame. Accordingly, before the cable module IC is packed (e.g., into an SOIC packaging), the signal wire may be connected to a contact pad of the lead frame by a suitable permanent method, such as ultrasonic or laser bonding. Finally, this arrangement of the coaxial cable connected by its signal wire to the dedicated contact pad of the lead frame together with the respective integrated cable module circuit may be packaged by a suitable material (e.g., plastics or other moldable material) for IC packaging. As a result, a closer and more direct connection of the signal wire in/into the cable module circuit may potentially be achieved. Moreover, the entire cable connection may come as one entity or cable connection unit comprising two standardizable IC packages, for example SOIC packages, which may be interconnected by the cable, such as a suitable coaxial cable. Then, this cable connection unit may simply be mounted to the printed circuit boards of an electronic device by the device manufacturer. In this example and similar embodiments, the distance of the direct and permanent connection of a signal wire in/into the integrated cable module circuit may be further reduced.

In certain embodiments, additional advantages may be realized when the best possible matching of transceiver impedance to cable impedance is performed, and the transceiver capacitance in the cable modules is minimized.

Certain embodiments may use a high-quality coaxial cable (or a pair of coaxial cables) for the cable connection, so that external interference may be reduced, and to increase the accuracy of the impedance tolerance matching between the transceiver and the cable. Further, a good-quality coaxial cable may have a thick outer conductor that may attenuate ESD pulses so that only a limited ESD protection might be needed on the transceiver side. By implementation of only limited ESD protection (which is necessary during manufacturing) on the transceivers capacitive load at the transceiver may be further reduced. "High-quality" or "good-quality" coaxial cable may refer to a cable that provides tight impedance tolerances, for example 2% to 5%, low dielectric losses, for example loss tangent (synonym for dissipation factor) of at least 0.002. Further, the thick outer connector for shielding may be composed of a metal foil and braided mesh wire instead of very thin moralized polyethylene foil.

Further, the transceivers may be made using modern semiconductor technology and manufacturing processes, which may result in relatively accurate tolerances. Modern semiconductor technology may refer to CMOS technology less than or equal to 65 nm (e.g., even as low as 45 nm CMOS or lower). Further, resonance tunnel diode (RTD) technology can be applied, which may be able to speed signals (e.g., up to 80 Gb/s). In some embodiments, signal wires of the coaxial cable(s) may be connected directly to silicon (chip/die) of the transceiver circuits, so that package and connector impedance discontinuations may be further avoided. As a result, the connection between cable conductors and the integrated cable module circuit part may form a sealed single component.

According to another aspect, the output capacitance of the driver circuits of the integrated cable module circuit may be reduced, for example, by using NMOS pull-up and pull-down transistors as driving elements instead of PMOS pull-up transistor. Additionally, resistive pull-up and NMOS pull-down transistors may provide for small output capacitance.

In another further development, the serial link may comprise an embedded clocking. An example for an application of this kind of link may be MIPI's M-PHY. Such implementations may have additional advantages in applications/products where an optical fiber connection may be used, for example, through the hinge connecting two parts of the phone.

In further examples, in electronic devices using several wires/cables in an interconnection, an embodiment involving a bidirectional 1-cable solution can be applied to enable further miniaturization of connection mechanics (e.g. hinges) between the moving parts of the electronic devices. Furthermore, bidirectional 1-cables might also be used when the number of signal wires should be reduced or should be small.

As stated above, certain embodiments relate to a cable connection with at least one cable as a wire conducted signal interconnection between two cable module circuits connected to respective ends of the cable connection. Cable conductors may be directly and permanently electrically connected at each end to contacts at a cable module circuit. The cable module circuits may be arranged for sending and/or receiving of a wire-conducted signal transmitted via the cable connection. During fabrication of the integrated cable module, the cable module circuits can be matched to the cable impedance with high accuracy. Further, by connecting the cable permanently and directly to transceiver circuits at each end of the cable, the connection may be protected from other kinds of disturbances. Thus, high simultaneous bidirectional bit rates may potentially be possible using this kind of interconnection between electronic units or modules.

It is to be noted that the present invention is not restricted to the embodiment described above, but can be implemented in any circuit where at least two functional portions of circuit which require a high-speed data connection are to be connected by means of a wire conducted interconnection. Additionally, this cable connection design may be a cost-effective solution for mobile devices that send signals through a flexible mechanical structure such as a hinge. Thus, many modern mobile electronic devices, such as mobile phones, laptops, personal digital assistants or alike, may use one or more embodiments of the disclosed cable connection design.

While there have been shown and described and pointed out fundamental features of the invention as applied to the embodiments thereof, it will be understood that various omissions and substitutions and changes in the form and details of the devices and methods described may be made by those skilled in the art without departing from the present invention as defined in the attached claims. For example, it is expressly intended that all combinations of those elements and/or method steps, which perform substantially the same function in substantially the same way to achieve the same results, be within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of designed choice.

The invention claimed is:

1. Apparatus comprising:
   at least one cable comprising a wire conducted signal interconnection between two cable module circuits connected to cable conductors at the opposite ends of the cable;
   wherein one or more signal wires of the cable conductors are directly and permanently electrically connected to each end of the cable with contacts of the respective cable module circuit, and wherein the cable module circuits are configured for simultaneous bidirectional signaling via the apparatus; wherein each of the cable module circuits is adapted to an impedance and length of the cable by matching input and output impedances of the cable module circuits to the respective cable impedance.

2. The apparatus according to claim 1, wherein the cable comprises a shielded pair of cables configured for simultaneous bidirectional differential signaling.

3. The apparatus according to claim 1, wherein the cable comprises a pair of coaxial cables configured for simultaneous bidirectional differential signaling.

4. The apparatus according to claim 1, wherein each of the cable module circuits comprises transceiver units configured to send and receive a wire-conducted signal via the apparatus.

5. The apparatus according to claim 1, wherein the cable comprises an outer conductor, said outer conductor connected to a ground potential of at least one of the cable module circuits.

6. The apparatus according to claim 1, wherein the cable comprises an outer conductor having a thickness adapted to attenuate electronic discharge pulses and provide electronic discharge protection at the cable module circuits.

7. The apparatus according to claim 1, wherein each of the cable module circuits comprises a multi-gigabit bidirectional transceiver.

8. Apparatus comprising: at least one cable comprising a wire conducted signal interconnection between two cable module circuits connected to cable conductors at the opposite ends of the cable; wherein one or more signal wires of the cable conductors are directly and permanently electrically connected to each end of the cable with contacts of the respective cable module circuit, and wherein the cable module circuits are configured for simultaneous bidirectional signaling via the apparatus; wherein the cable module circuits are integrated cable module circuits, and wherein the cable contact for at least one of the integrated cable module circuits is a direct bump on at least one of a contact pad, a repassivation or redistribution pad, and a thick repassivation or redistribution pad.

9. The apparatus according to claim 8, wherein the at least one cable is fixed to a support board, and wherein the one or more signal wires of the cable conductors are directly and permanently connected to the support board and to the cable contact of at least one of the integrated cable module circuits by means of a bonding wire.

10. The apparatus according to claim 8, wherein at least one of the cable module circuits is packed into a molded circuit package, the molded circuit package comprising connection means for permanently mounting the packed cable module circuit to a circuit board, the connection means comprising at least one of a connection pin, a connection bump, and a connection ball, and wherein at least one of the signal wires is directly and permanently connected to one of the cable module circuits via a printed wiring board having electrical connections to the contacts of the cable module circuit.

11. The apparatus according to claim 10, wherein at least one of the integrated cable module circuits is interconnected in a flip chip arrangement.

12. The apparatus according to claim 10, wherein at least one of the integrated cable module circuits is interconnected to a lead frame with lead frame contact pads, and wherein at least one of the signal wires of the cable conductors is connected to one of the lead frame contact pads.

13. An integrated circuit comprising:
contacts for interconnection of the integrated circuit,
wherein the integrated circuit is a cable module circuit arranged for simultaneous bidirectional signaling via a cable connection;
wherein the cable module circuit is directly and permanently electrically connected to signal wires of one or more cable conductors, and
wherein the cable module circuit is configured to connect to one end of a cable via the one or more cable conductors and configured to form a wire-conducted signal interconnection with another cable module circuit, the other cable module circuit being connected to one or more different cable conductors at the other end of the cable wherein the cable module circuit comprises an electronic discharge protection circuit configured to attenuate electronic discharge pulses, and wherein the configuration of the electronic discharge protection circuit is based on a predetermined thickness of an outer conductor of the cable.

14. The integrated circuit according to claim 13, wherein the cable module circuit comprises transceiver units configured to send and receive a wire-conducted signal via the cable.

15. The integrated circuit according to claim 13, wherein the cable module circuit is adapted to a predetermined cable impedance and a predetermined cable length.

16. The integrated circuit according to claim 13, wherein at least one of the contacts of the cable module circuit is a direct bump on of at least one of a contact pad, a repassivation or redistribution pad, and a thick repassivation or redistribution pad.

17. The integrated circuit according to claim 13, wherein the cable module circuit is arranged to be interconnected in a flip chip arrangement.

18. The integrated circuit according to claim 13, wherein the cable module circuit is interconnected to a lead frame with lead frame contact pads, and wherein at least one signal wire of the cable conductors is connected to one of the lead frame contact pads.

* * * * *